United States Patent
Tinner et al.

(10) Patent No.: US 6,453,543 B1
(45) Date of Patent: Sep. 24, 2002

(54) TRANSPORT AND TRANSFER DEVICE

(75) Inventors: Peter Tinner, Sevelen; Josef Marthy, Walenstadt; Roman Schertler, Wolfurt; Stephan Voser, Buchs, all of (CH)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/283,251

(22) Filed: Apr. 1, 1999

Related U.S. Application Data

(63) Continuation of application No. PCT/CH97/00344, filed on Sep. 17, 1997.

(30) Foreign Application Priority Data

Oct. 1, 1996 (CH) ................................................ 2386/96

(51) Int. Cl.$^7$ ................................................ H01F 7/06
(52) U.S. Cl. .................... 29/607; 29/715; 294/65.5; 414/744.6; 414/744.8; 414/786; 414/908; 414/935; 414/939; 901/40
(58) Field of Search ............... 414/744.6, 744.8, 414/786, 935, 939, 908; 29/607, 715; 294/65.5; 901/40

(56) References Cited

U.S. PATENT DOCUMENTS

| | | | | |
|---|---|---|---|---|
| 4,572,956 A | * | 2/1986 | Tojo | 250/492.2 |
| 4,699,554 A | * | 10/1987 | Kawashima | 414/217 |
| 4,832,781 A | * | 5/1989 | Mears | 156/345 |
| 4,874,076 A | * | 10/1989 | Kaplan | 198/370 |
| 5,382,127 A | * | 1/1995 | Garric | 414/217 |
| 5,451,131 A | * | 9/1995 | Hecht | 414/217 |
| 5,590,994 A | * | 1/1997 | Schertler | 414/227 |

FOREIGN PATENT DOCUMENTS

| | | |
|---|---|---|
| DE | 39 36 385 A | 5/1991 |
| DE | 795 15 882 C | 5/1996 |
| EP | 0 591 706 A | 4/1994 |
| JP | 01118433 | 5/1989 |
| JP | 04010553 | 1/1992 |
| WO | WO 87 04414 | 7/1987 |

\* cited by examiner

Primary Examiner—Peter Vo
Assistant Examiner—Paul D. Kim
(74) Attorney, Agent, or Firm—Crowell & Moring LLP

(57) ABSTRACT

Disclosed is a workpiece conveyor and delivery device for a vacuum processing plant. Workpieces are delivered from one device to another, both devices being located opposite each other and moving in relation to each other. A controllable magnet arrangement is provided on one of the devices. A moveable armature element acts as a holding device for the workpiece on one of the two devices which move in relation to each other, namely the device provided with the magnet arrangement. Magnet arrangement is driven to activate the holding device which can be deactivated for delivery of workpiece.

6 Claims, 7 Drawing Sheets

TRANSPORT AND TRANSFER DEVICE

CROSS-REFERENCE TO RELATED APPLICATIONS

This application is a Continuation of PCT Application No. PCT/CH97/00344 filed on Sep. 17, 1997.

BACKGROUND AND SUMMARY OF THE INVENTION

The present invention relates to a transport and transfer device.

A device of this type is known from EP-0 591 706. A workpiece in the form of a disc is fixed in a star-shaped transport arrangement by clamping it between a permanent magnet on the device and an armature piece.

In a transfer area to an additional transport device the armature is lifted off its seat, against the force of the permanent magnet, under control of an electromagnet so that the disc-shaped workpiece is released for transfer by means of a mechanically actuated holder on the additional transport device.

Conversely, that is, for transfer in the opposite direction, the armature is released by the electromagnet and placed on the workpiece clamped by a mechanically actuated holder so that it is picked up at the receiving transport device by the force of the permanent magnet. The workpiece is then released to the receiving transport device by the mechanically actuated holder.

The disadvantage of this design is that there is a mechanically actuated and controlled arrangement on the one device. In addition to the complex design the mechanical movements are problematic under vacuum conditions: It promotes particle formation which leads to higher workpiece reject rates. The greater the number of mechanically moved parts in the vacuum atmosphere the greater the potential for faults in the process execution which consequently impairs the reliability of the equipment. In addition this mechanical holder increases the cycle time of the overall system which ultimately increases the manufacturing and operating costs of the system and thereby the costs for the processed workpieces.

The objective of this invention is to eliminate the disadvantages of a device of the aforementioned type.

This is achieved in accordance with the present invention by fitting both arrangements which are movable relative to each other with at least one magnet, each as part of the controllable magnet arrangement, and by having said magnet with the armature part forming a workpiece holder in both arrangements, and by controlling the magnet arrangement in the transfer area in such a way that the armature of one or the other arrangement becomes holding, a device without any mechanical joints, meshing parts, etc. is achieved. This significantly improves the reliability of the device. The transfer cycle time can be significantly reduced, preferably by more than 25%, for example, as in the case of the subsequently described device, from the usual 10 sec. to less than 7.5 sec. This results in significant cost reductions, on the one hand due to the simplicity of the design, in the manufacture of a corresponding system, as well as in the operating costs and consequently the production costs of the workpieces treated by the system.

If workpieces, and in particular disc-shaped workpieces such as mini-disks, compact disks, hard disks, MO disks or semiconductor wafers are to be surface-masked before treatment in the system with a device according to the invention, at least one of the armature parts is simultaneously used as a masking element so that the holder, transfer function and masking can be optimally combined. In this way the aforementioned advantages can be even better realized.

The preferred designs of the device according to the invention, their implementation on a vacuum chamber or a vacuum treatment system as well as the basic transport and transfer techniques according to the invention, and the preferred utilization, are described below.

BRIEF DESCRIPTION OF THE DRAWINGS

The invention is subsequently explained by means of illustrations. Illustrated are:

FIG. 8 is a schematic enlarged view of the device according to the invention in the transfer/receiving position according to FIG. 7a;

DETAILED DESCRIPTION OF THE INVENTION

Figure 1:
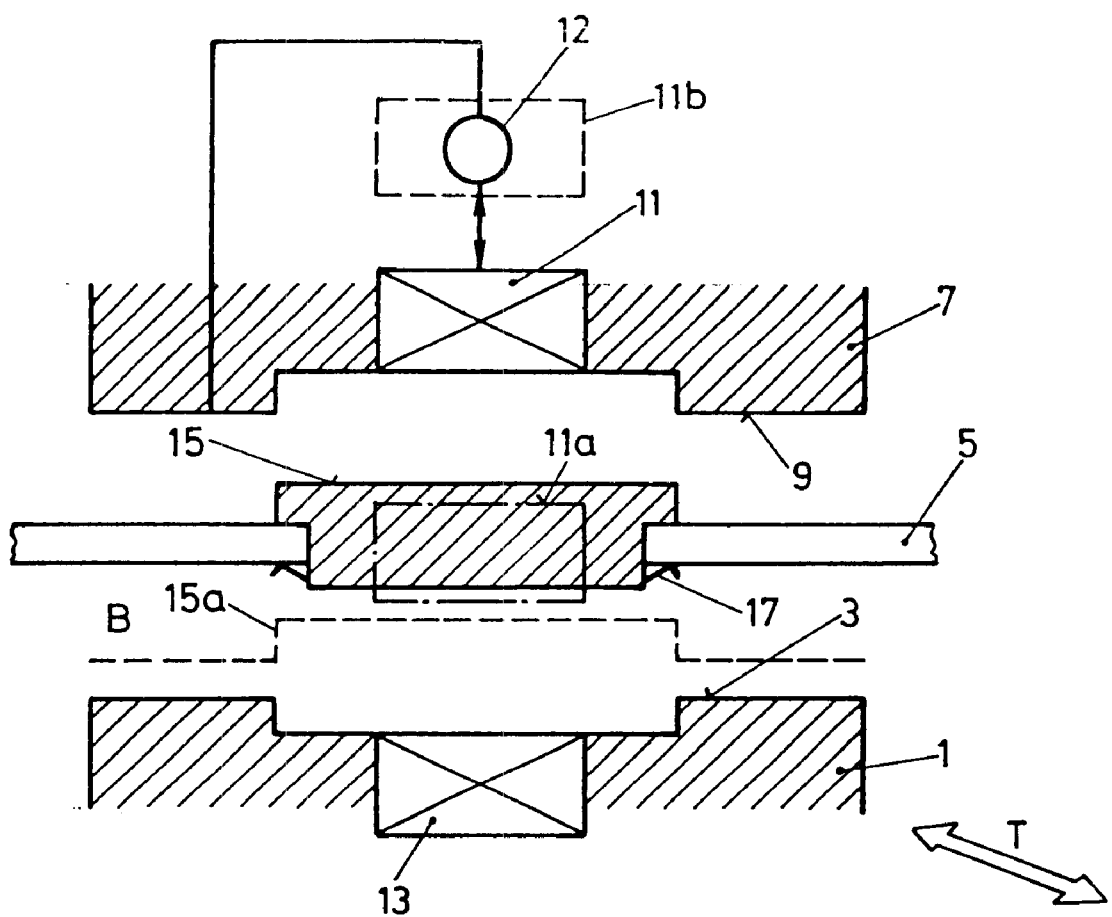
FIG. 1 is a schematic representation of the basic operating principle of the device according to the invention.

FIG. 1 schematically shows a transport arrangement 1 which, as indicated by the double arrow T, is driven inside a vacuum chamber (not illustrated).

Along its movement path a holder 3 for workpiece 5 is positioned in transfer area B opposite another arrangement 7 with a holder 9. The arrangement 7 can either be stationary or also a transport device.

Both arrangements 1 and 7 have at least one magnet element 11 or 13 respectively. In addition a follower armature 15 is provided as a separate part for a workpiece 5 which is schematically represented as a disc with a center hole. The follower armature consists at least partially of magnetic material. When the workpiece 5 and the follower armature 15 rest on the transport arrangement 1 as shown by the dashed line at 15a, workpiece 5 is held in place by follower armature 15 due to the interaction of magnet arrangement 13 with the follower armature 15. If (not shown) workpiece 5 and the follower armature rest on the transport arrangement 7, the follower armature 15 also holds the workpiece 5 in place due to the interaction between the magnet arrangement 11 and the follower armature 15.

In transfer area B the magnet arrangements 11 and 13 are at least part of a controllable magnet arrangement. Under the most general aspect of the present invention the controllable magnet arrangement can be implemented by designing one and/or the other magnet arrangement 11 or 13 as an electromagnet; in an especially preferred design version the magnet arrangements 11 and 13 are designed as permanent magnets. The entire device according to the invention is then based on the utilization of permanent magnets according to FIG. 1. However, the magnets can also be attached to armature 15 with the stationary parts of the device consequently being made of magnetic material.

For transferring workpiece 5 away from arrangement 1 to arrangement 7, the permanent magnet arrangement 11 must overcome the retention force of the permanent magnet arrangement 13. According to this invention this is solved in such a way that magnet arrangement 11 is designed with a stronger magnetic force than magnet arrangement 13. With the follower armature 15 in position 15a the permanent magnet arrangement 11 represented by dash-dotted lines in position 11a, is advanced by drive 12 toward the receiving element 3 and picks up the follower armature 15 against the retention force of magnet arrangement 13. Preferred on the armature are detachable fixing elements 17, for example, springy clips, detents such as spring-loaded balls that fix workpiece 5 to the follower armature 15. Together with the follower armature 15 also workpiece 5 is picked up by magnet arrangement 11 and returned to receiving holder 9.

For returning workpiece 5 and the follower armature 15 from arrangement 7 to arrangement 1, magnet arrangement 11 is basically retracted to position 11b shown with dashed lines, or magnet arrangement 13 is pushed forward against the follower armature 15 (not shown) until the retention force of magnet arrangement 13 again dominates.

The described principle is consequently based on connecting the workpiece separably with the follower armature and to shuttle the latter between a permanent magnet on the one arrangement and a permanent magnet on the other arrangement where the magnetic force is controlled by varying the distance of the receiving magnet relative to the transferring magnet.

An additional, very important advantage of the procedure according to this invention is that no additional transport vehicle needs to be provided for the workpiece, neither for the transfer nor for the transport at one or both arrangements 7 or 1.

Figure 2:
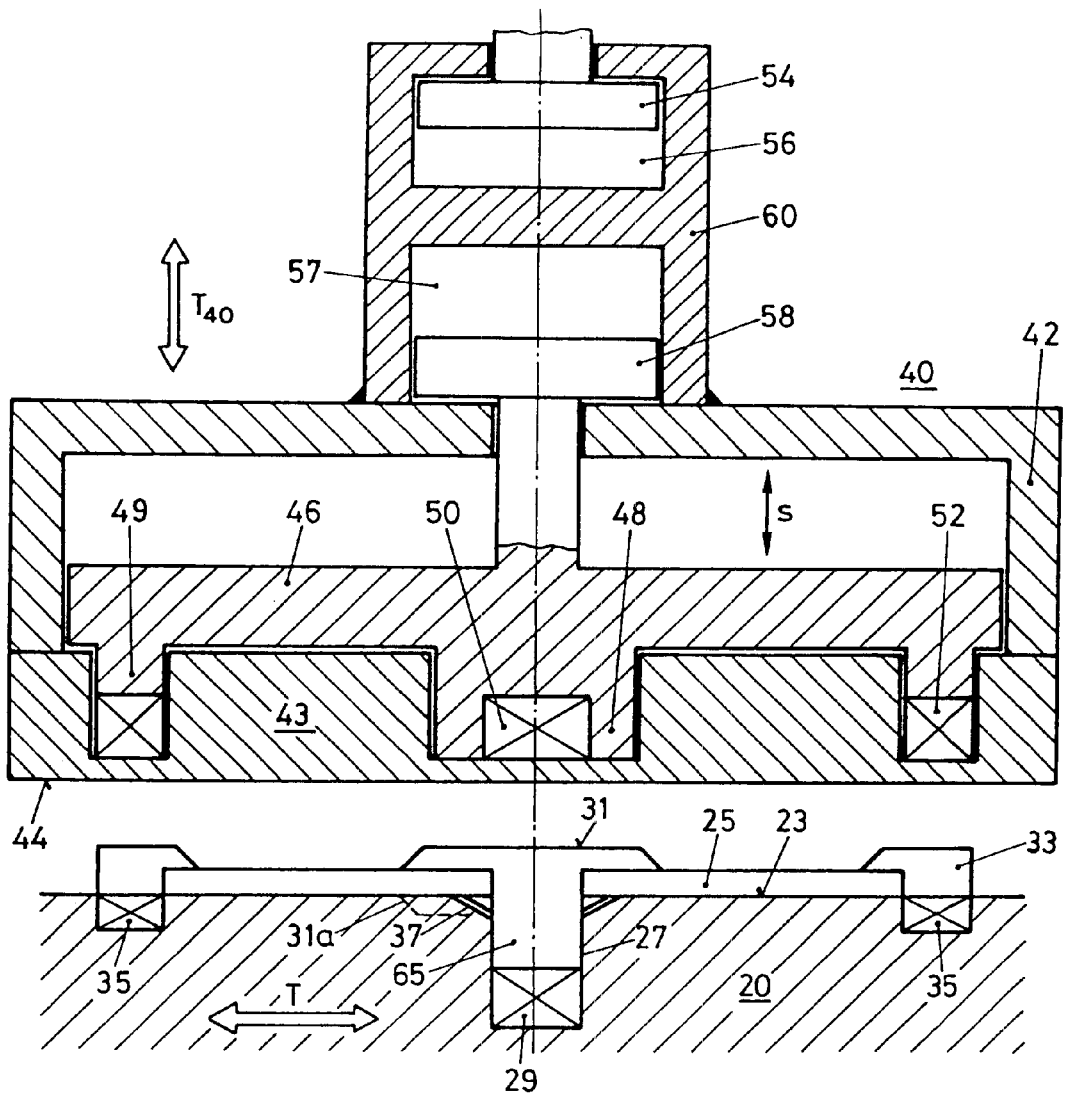
FIG. 2 is a schematic longitudinal cross-section of a preferred design version of the device according to the invention.

FIG. 2 schematically shows a preferred design version of the present invention. This arrangement is designed for handling disc-shaped workpieces with a center hole which before treatment in the vacuum system, such as in a coating application, need to be masked in their center area as well as the peripheral area.

On the one arrangement 20, as shown with the double arrow T corresponding to a transport arrangement, a holding surface 23 for workpiece 25 is provided. In the center of holding surface 23 a blind hole 27 is provided on the base on which a permanent magnet 29 is installed. Workpiece 25 is deposited on holding surface 23 where it is clamped by the magnetic follower armature 31 designed as a central mask. The periphery of workpiece 25 is clamped to transport arrangement 20 by masking ring 33 equipped with peripheral magnets 35 that also functions as an armature.

The central follower armature 31 holds the workpiece 25 by means of spring clips 37. Spring-loaded balls can be used in place of spring clips.

The second arrangement 40 comprises a cylinder 42 with a termination plate 43 that forms a holding surface 44. A piston 46 glides within the cylinder space of cylinder 42. Permanent magnets 50 and 52 are installed at a central protrusion 48 and a peripheral ring protrusion 49. Through the movement s of piston 46 and appropriate recesses in termination plate 43 of cylinder 42 the magnets 50 and 52 are positioned immediately into the area of surface 44 or retracted from the latter as illustrated. Arrangement 40 is also a transport arrangement in which cylinder 42 is the end of a transport plunger arrangement, T40. A plunger piston 54 glides inside cylinder space 56 which is installed together with a drive cylinder space 57 for a piston 58 and piston 46 in housing 60.

Magnets 52 and 50 are preferably stronger than magnets 35 and 29.

For transferring workpiece 25 from the illustrated position on arrangement 20 to arrangement 40, the entire cylinder 42 is moved forward against workpiece 25 and armature 33 or 31 by means of the piston/cylinder arrangement 54/60 with piston 46 in the illustrated forward position, until the force of magnets 50, 52 is sufficient to draw the armatures 33, 31 together with workpiece 25 to surface 44. The workpiece, held by armatures 31/33 can then be transported by arrangement 40.

Conversely, for returning workpiece 25 with armatures 33/31 to the arrangement 20, piston 46 and magnets 50, 52 are retracted from the position shown in FIG. 2 by means of the piston/cylinder arrangement until the force of magnets 35/29 overcomes the retention force of the retracted magnets 50/52. After the transfer the transport can continue with arrangement 20.

In this way a very simple transport and transfer device is created that is based solely of the effect of preferably permanent magnets whose interaction with the magnetic follower and fixing armature for the workpiece is controlled by the corresponding effective distances.

Figure 3:
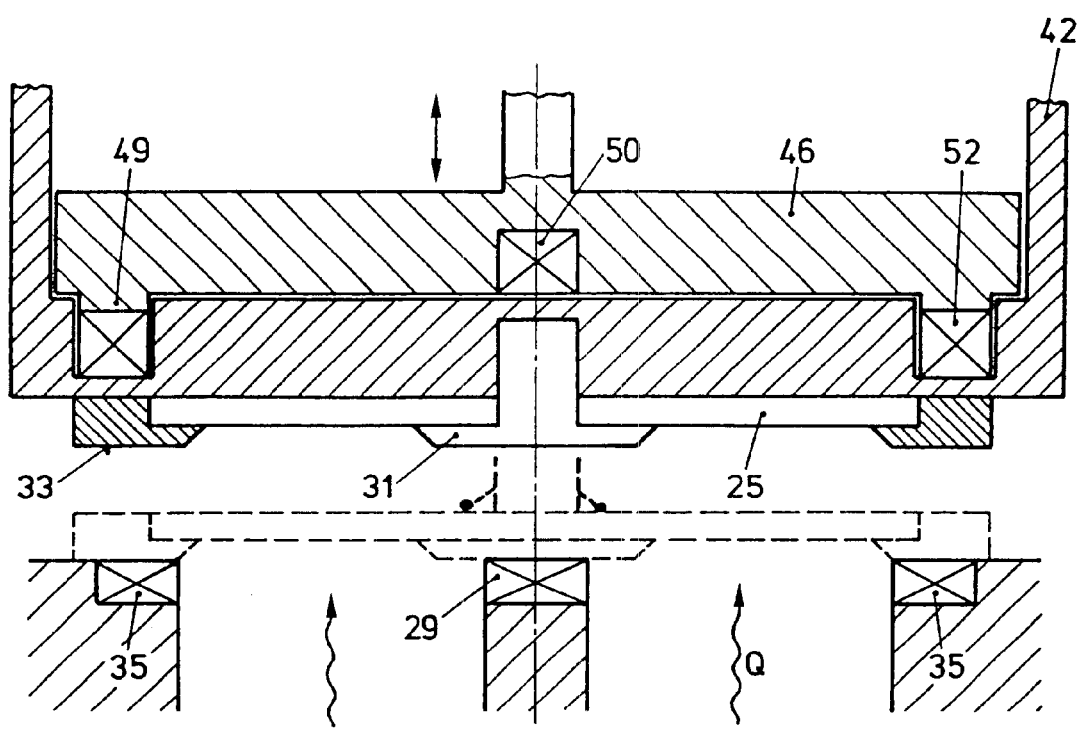
FIG. 3 Another design of the invention based on the representation in FIG. 2.

Of course, it is also possible to design one of the two arrangements 40 or 20 illustrated in FIG. 2, preferably arrangement 20, as a stationary device, for example, as a feeding-opening area for a treatment chamber. In this case the holding and masking armatures 33 or 31 are, of course, reversed, as shown schematically at 31a with dashed lines, and in particular the central area of surface 44 and piston 46 are designed to accommodate the central prolongation of central mask 31. This constellation is schematically illustrated in FIG. 3. In view of what has been said so far, no further information is needed. The processing effect is schematically shown with Q.

When several armature elements are used as shown, for example, in FIG. 1, 2, or 3, one and/or the other armature can be fitted with holding devices in the form of spring clips or ball detents illustrated at 17 in FIG. 1, depending on the design.

The procedure according to the invention achieves not only an elegant transport and transfer technique as described further above, but as has been demonstrated additional masking steps in the system are avoided and as has been mentioned eliminates the need for an additional transport vehicle that "accompanies" a workpiece such as the aforementioned disks through the system. This increases the reliability of the system, and the cycle times are shortened by at least 25% in comparison with systems in which a separate masking step is necessary.

Figure 4:
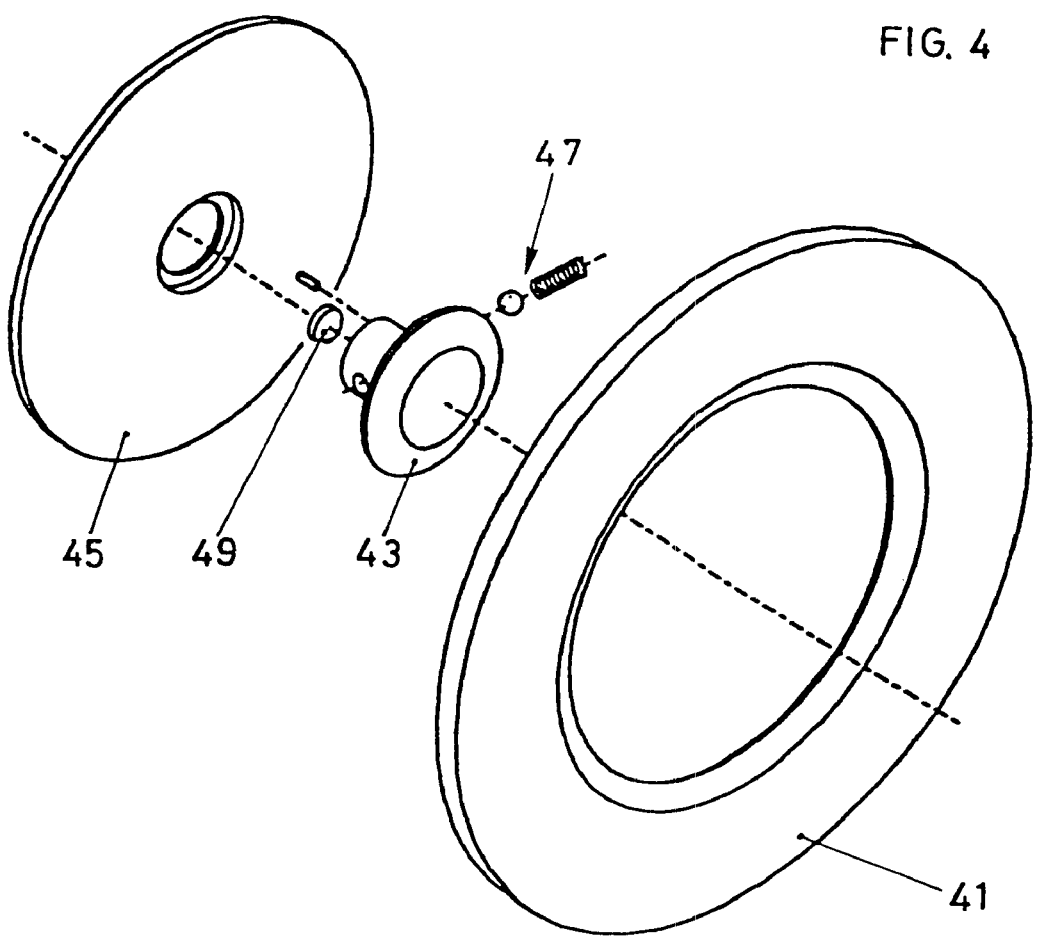
FIG. 4 Exploded view of a preferred armature design for handling a disc-shaped workpiece with center hole.

FIG. 4 is an exploded view of a preferred design of the follower armatures 41 and 43 with respect to a workpiece 45. On the central follower armature 43 at least one ball detent 47 is provided as a holder for workpiece 45. A permanent magnet 49 that is part arranged on the follower armature 43 is part of the magnetically active material.

Figure 5:
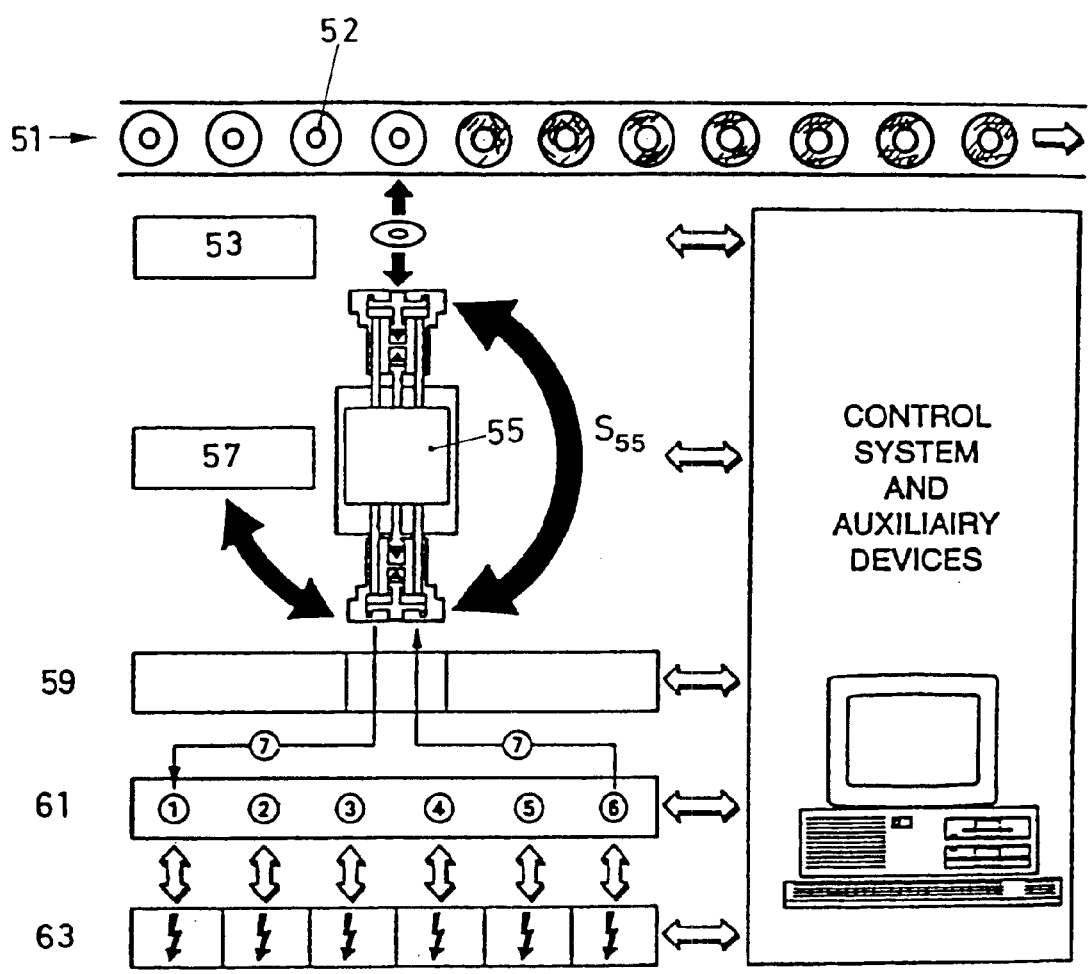
FIG. 5 is a schematic diagram of a treatment system with implementation of the device according to the invention and the functional units of the system.

FIG. 5 shows a system with transport and transfer device according to the invention. Illustrated are:

51: Belt conveyor for the workpiece discs 52;

53: Transport robot;

55: Two-armed transport arrangement in a vacuum chamber (not shown), pivotable around its axis as shown in $S_{55}$, where parts of the transport and transfer device according to the invention are mounted on both arms designed as plungers;

57: A loading station for the follower armatures according to the invention which are inserted into the transport arms of transport arrangement 55 through a corresponding opening in the vacuum chamber (not illustrated);

59: A load lock chamber;

61: A main transport chamber of the system with several process chambers 63.

Figure 6:
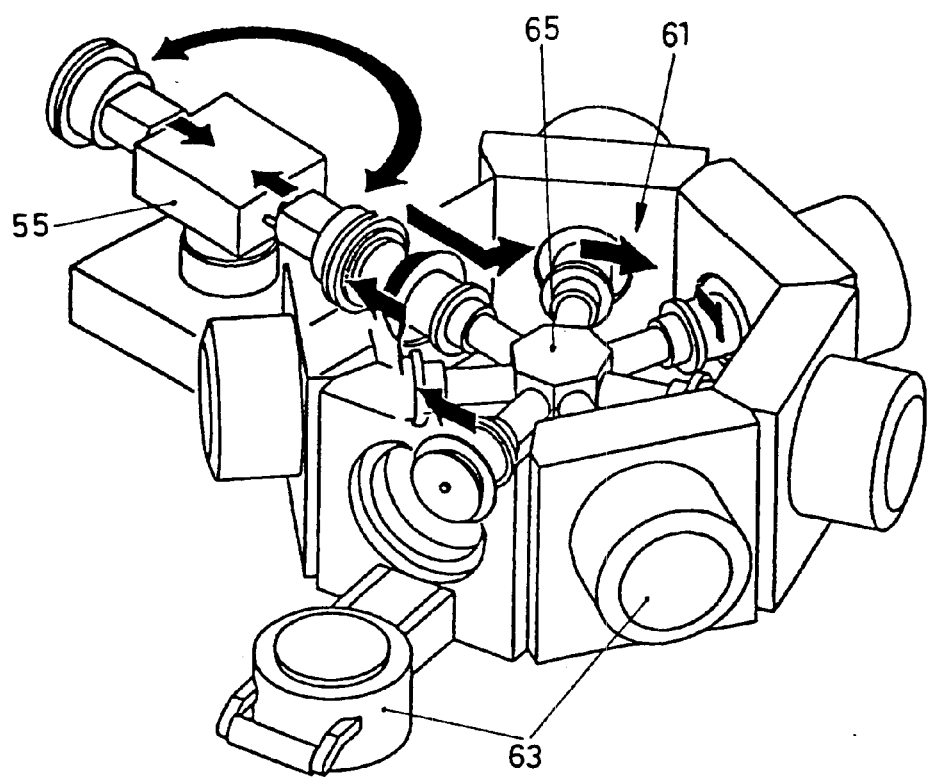
FIG. 6 is a simplified perspective view showing the primary functional process elements of the system illustrated in FIG. 5.

FIG. 6 shows process chambers 63, one of which is open. They are flanged to a main transport chamber 61. In the main transport chamber 61 a rotary transport star 65 is provided with a number of plungers, each of which is equipped with elements for transport and transfer in accordance with the invention. Through an opening the workpiece discs are shuttled by the two-armed transport arrangement 55 in the direction of the arrow as shown in FIG. 4 by means of the armatures 41 or 43 which function as masks. arrows as shown in FIG. 4 by means of the armatures 41 or 43 which function as masks.

Figures 7A, 7B:
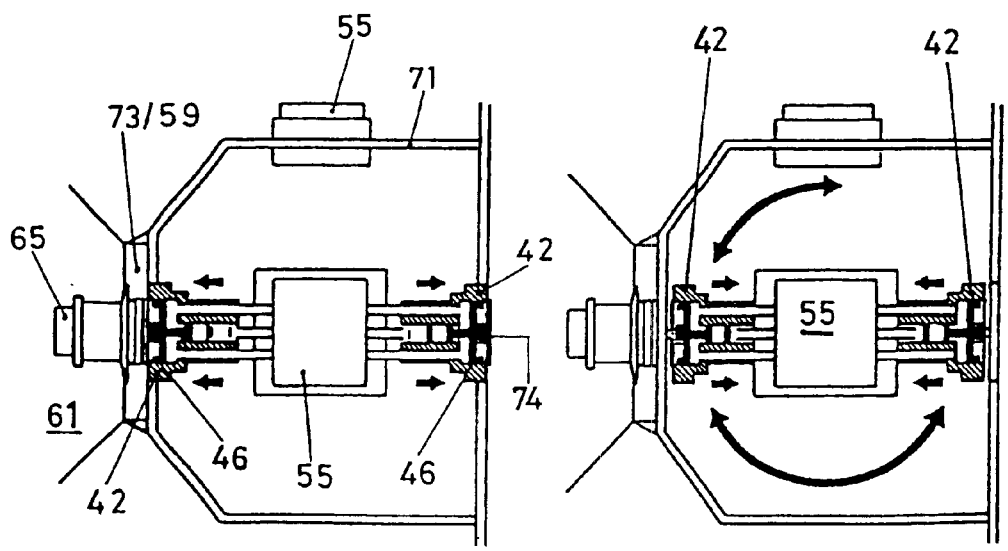
FIG. 7a is a chamber according to the invention on the system according to FIG. 5 or 6, with the device according to the invention shown in the receiving/transfer position.
FIG. 7b is a Chamber according to 7a with the device in the transport position.

FIG. 7a shows the two-armed transport arrangement 55 in the corresponding transport chamber 71 as it interacts with the main transport chamber 61. At the transfer opening 73 a load lock 59 is integrated, possibly also one on opening 74. In accordance with the position of FIG. 7a and with respect to FIG. 2 the transport plungers 42 are extended and together with the corresponding openings in chamber 71 constitute a seal. Pistons 46 are also extended and together with the corresponding magnets 50, 52 (not shown in FIG. 7) fix the workpiece discs and their follower armatures (not shown here). In this position the transport arrangement cannot be pivoted but is locked in the transfer/receiving position. With the one illustrated plunger of transport arrangement 65 in the main transport chamber 61 a workpiece with the corresponding follower armatures is picked up from or returned to transport arrangement 55.

The same applies with respect to the pick-up or transfer of a workpiece at the second chamber opening 74. As can be seen in the transfer area to the main transport chamber 61, both plungers acting on this opening with the corresponding opening edge function as a seal in such a way that the opening itself, through the thickness of its wall, functions as a lock chamber. The lock valves are implemented through the corresponding plungers.

When pistons 46 are still extended as shown in FIG. 7b, plungers 42 are retracted so that arrangement 55 is in the pivotable transport position.

Figure 8:
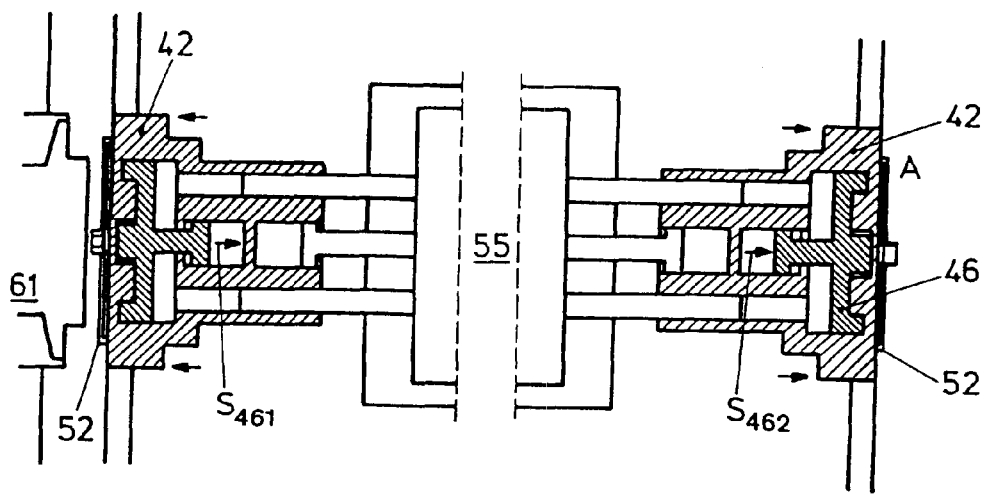

In FIG. 8 the two plungers on transport arrangement 55 according to FIG. 7 are shown in more detail. Both plungers are extended and seal at the corresponding opening edges. As indicated by arrow $S_{461}$ the left-hand piston is retracted momentarily in conjunction with a plunger of the main transport arrangement 61 which means that workpiece 52 with the corresponding follower and masking armatures 41, 43 shown in FIG. 4 are transferred to the plunger on the main chamber side. At the same time piston 46 on the right-hand plunger is extended as shown by arrow $S_{462}$ and picks up a workpiece 52 with the corresponding follower armatures 41 or 43 functioning as masks.

As can be seen from FIGS. 7 and 8, the forward movements of pistons 46 provided at several plungers of a transport arrangement, can be controlled independently of each other which may be desirable also for the movement of plungers 42.

Figure 9A:
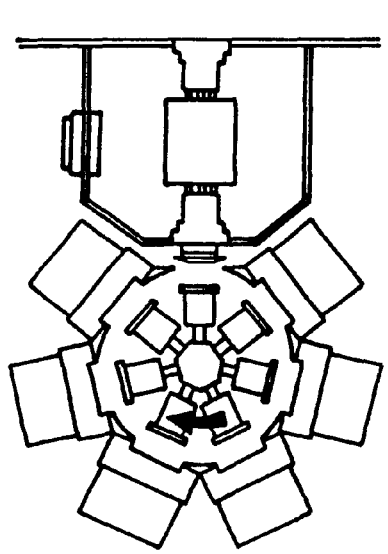
FIGS. 9a and 9b are a schematic view and top view of a part of the system according to FIG. 6 in the transport position (a) and in the treatment or receiving/transfer position (b).
Figure 9B:
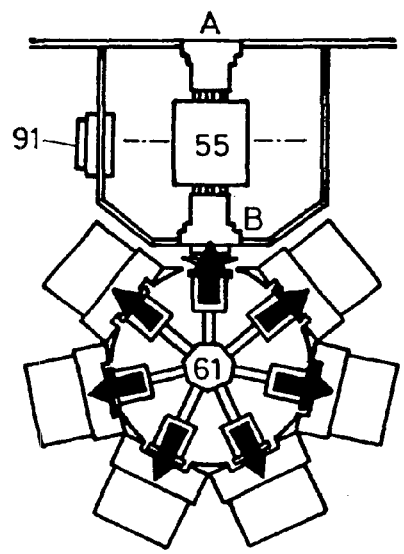

FIG. 9 schematically shows the transport position (a) of the plungers on the main transport arrangement 65 according to FIG. 6 as well as in the treatment position or transfer position according to diagram (b). By observing FIG. 9b the flow-through cycle for workpieces becomes apparent:

In A an untreated workpiece is picked up from 55;

In B a treated workpiece is transferred from 61 to 55;

55 is pivoted;

Said treated workpiece is output at A and at B the treated workpiece is transferred to 61, 61 is pivoted further.

As can be seen on the right-hand side of FIG. 8 the workpiece discs in position A can be further transported without being accompanied by the masking and follower armatures. Looking back at FIG. 9 these pass through the treatment cycles of the workpieces several times and are replaced at arrangement 91 only as required and after relatively many treatment cycles for which A purpose transport arrangement 55 is pivoted into the intermediate position shown in FIG. 9b with dash-dotted lines.

What is claimed is:

1. A method for manufacturing storage disks or semiconductor wafer workpieces, comprising:

releasably filing a transfer armature member comprising magnetic material to a respective workpiece, magnetically attracting said transfer armature member with said workpiece fixed thereto towards and onto a first transport arrangement, moving said first transport arrangement with said transfer armature member and said workpiece magnetically attracted thereto towards and into a transfer position, magnetically attracting in said transfer position said transfer armature member with said workpiece from said one transport arrangement towards and onto a further transport arrangement, moving said further transport arrangement with said transfer armature member and said workpiece magnetically attracted thereto towards a treatment station, moving said further transport arrangement with said transfer armature member and said workpiece magnetically attracted thereto from said treatment station towards and into a further transfer positions and magnetically attracting at said further transfer position said transfer armature member with said workpiece from said further transport arrangement towards and onto a still further transport member.

2. The method of claim 1, wherein said still further transport member is said one transport member and said one transfer position is said further transfer position.

3. The method of claim 1, further comprising the step of providing said workpiece in a disk-shaped configuration having a central hole with said transfer armature member through said central hole.

4. The method of claim 1, wherein said workpiece is of non-magnetic material.

5. The method of claim 1, wherein said workpiece is one of a mini disk, a compact disk and a hard disk.

6. A method for manufacturing storage disks or semiconductor wafer workpieces according to claim 1, wherein said still further transport arrangement is formed by said first transport arrangement, and said further transfer position is formed by said one transfer position.

* * * * *